United States Patent
Do et al.

(10) Patent No.: US 12,218,182 B2
(45) Date of Patent: Feb. 4, 2025

(54) SEMICONDUCTOR DEVICE AND METHOD FOR FABRICATING THE SAME

(71) Applicant: SK hynix Inc., Gyeonggi-do (KR)

(72) Inventors: Kwan Woo Do, Gyeonggi-do (KR); Wan Joo Maeng, Gyeonggi-do (KR); Jeong Yeop Lee, Gyeonggi-do (KR); Ki Vin Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 366 days.

(21) Appl. No.: 17/517,527

(22) Filed: Nov. 2, 2021

(65) Prior Publication Data

US 2022/0359643 A1   Nov. 10, 2022

(30) Foreign Application Priority Data

May 4, 2021   (KR) .......................... 10-2021-0057713

(51) Int. Cl.
*H01G 4/10* (2006.01)
*H01G 4/008* (2006.01)
*H01L 49/02* (2006.01)

(52) U.S. Cl.
CPC ............. *H01L 28/75* (2013.01); *H01G 4/008* (2013.01); *H01G 4/10* (2013.01)

(58) Field of Classification Search
CPC ....... H01L 28/75; H01L 23/642; H01L 28/60; H01L 28/90; H01G 4/008; H01G 4/10
See application file for complete search history.

(56) References Cited

U.S. PATENT DOCUMENTS

| | | | |
|---|---|---|---|
| 8,319,296 B2 | 11/2012 | Do et al. | |
| 8,372,746 B2 | 2/2013 | Do et al. | |
| 8,796,087 B2 | 8/2014 | Kim et al. | |
| 2011/0128667 A1* | 6/2011 | Do | H01L 29/4966 438/653 |
| 2019/0189768 A1 | 6/2019 | Liao et al. | |
| 2020/0335333 A1 | 10/2020 | Kang et al. | |
| 2021/0066446 A1 | 3/2021 | Lee et al. | |
| 2022/0190101 A1* | 6/2022 | Bouvier | H01L 28/90 |
| 2022/0344166 A1* | 10/2022 | Park | H01L 21/31144 |

OTHER PUBLICATIONS

Office Action for Korean Patent Application No. 10-2021-00557713 issued by the Korean Patent Office on Dec. 18, 2024.

* cited by examiner

*Primary Examiner* — Wasiul Haider
(74) *Attorney, Agent, or Firm* — IP & T GROUP LLP

(57) ABSTRACT

Embodiments of the present invention provide a semiconductor device capable of improving current leakage property and a method for fabricating the same. According to an embodiment of the present invention, a capacitor comprises: a lower electrode; a dielectric layer over the lower electrode; and an upper electrode over the dielectric layer, the upper electrode including a conductive carbon-containing layer, wherein a carbon content in the conductive carbon-containing layer is more than 5 at % and equal to or less than 10 at %.

16 Claims, 13 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0057713, filed on May 4, 2021, which is herein incorporated by reference in its entirety.

BACKGROUND

1. Field

The present invention relates to a semiconductor device and a method for fabricating the same, and more particularly, to a semiconductor device including an electrode including a conductive carbon-containing layer, and a method for fabricating the same.

2. Description of the Related Art

Due to the development of electronic technology, downscaling of semiconductor devices has rapidly progressed recently, and accordingly, patterns constituting electronic devices have become finer. Accordingly, even when a dielectric layer having a relatively small thickness is formed in a capacitor having a fine size, there is a need to develop a structure capable of reducing a leakage current in the capacitor and maintaining a desirable electrical characteristic.

SUMMARY

Various embodiments of the present invention provide a semiconductor device capable of improving leakage current characteristics of a capacitor and a method for fabricating the same.

According to an embodiment of the present invention, a capacitor comprises: a lower electrode; a dielectric layer over the lower electrode; and an upper electrode over the dielectric layer, the upper electrode including a conductive carbon-containing layer, wherein a carbon content in the conductive carbon-containing layer is more than 5 at % and equal to or less than 10 at %.

According to an embodiment of the present invention, a method for fabricating a capacitor comprises: forming a mold structure over a substrate; forming an opening by etching the mold structure; forming a lower electrode disposed in the opening; exposing an outer wall of the lower electrode by removing the mold structure; forming a dielectric layer over the lower electrode; and forming an upper electrode over the dielectric layer, the upper electrode including a conductive carbon-containing layer, wherein a carbon content in the conductive carbon-containing layer is more than 5 at % and equal to or less than 10 at %.

According to another embodiment of the present invention, a semiconductor device comprises: a dielectric layer over a substrate; and a metal electrode over the dielectric layer, the metal electrode including a conductive carbon-containing layer, wherein a carbon content in the conductive carbon-containing layer is more than 5 at % and equal to or less than 10 at %.

The present invention has an effect of improving the reliability of a semiconductor device by improving the leakage current characteristics of a capacitor of the semiconductor device.

The present invention is effective in simplifying the fabrication process of the semiconductor device because it makes it possible to omit an interface layer which is typically interposed between a dielectric layer and an upper electrode of the semiconductor device.

The present invention may maximize the polarization efficiency of the semiconductor device by applying an electrode of low crystallinity on the dielectric layer, thereby reducing the stress of the dielectric layer.

DETAILED DESCRIPTION

Figure 1:
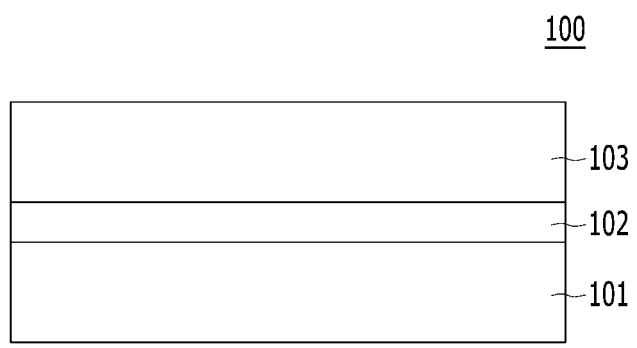
FIG. 1 is a diagram illustrating a capacitor according to an embodiment of the present invention.

Various embodiments described herein will be described with reference to cross-sectional views, plane views and block diagrams, which are schematic views of the present invention. Therefore, the structures of the drawings may be modified by fabricating technology and/or tolerances. The embodiments of the present invention are not limited to the specific structures shown in the drawings, but include any changes in the structures that may be produced according to the fabricating process. Also, any regions and shapes of regions illustrated in the drawings having schematic views are intended to illustrate specific examples of structures of regions of the various elements, and are not intended to limit the scope of the invention.

FIG. 1 is a diagram illustrating a capacitor according to an embodiment of the present invention.

As shown in FIG. 1, the capacitor 100 may include a lower electrode 101, a dielectric layer 102, and an upper electrode 103 which are stacked on each other in the recited order in a first direction also referred to hereinafter as the direction of stacking.

The lower electrode 101 may be made of a conductive material. For example, the lower electrode 101 may be made of a metal-based conductive material, simply referred to hereinafter as a metal-based material. The metal-based material may also be referred to as a metal-containing material. For example, the metal-based material may be a metal, a metal nitride, a conductive metal oxide, or a combination thereof. The metal-based material of the lower electrode 101 may include titanium (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$) or a combination thereof. In another embodiment, the lower electrode 101 may include a silicon-based material. The silicon-based material may also be referred to as a silicon-containing material and may include a silicon substrate, a silicon layer, a silicon germanium layer, or a combination thereof. In an embodiment, the lower electrode 101 may include a stack of a metal-containing material and a silicon-containing material.

The dielectric layer 102 may include a single layered structure, a multi-layered structure, and a laminated structure. The dielectric layer 102 may have a doping structure or an intermixing structure. The dielectric layer 102 may include a high-k material. The dielectric layer 102 may have a higher dielectric constant than silicon oxide ($SiO_2$). Silicon oxide may have a dielectric constant of about 3.9, and the dielectric layer 102 may include a material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer 102 may be formed of a composite layer including two or more layers formed of the high-k materials mentioned above. The dielectric layer 102 may be formed of zirconium (Zr)-based oxide. The dielectric layer 102 may have a stack structure including zirconium oxide ($ZrO_2$). The stack structure including zirconium oxide ($ZrO_2$) may include ZA ($ZrO_2/Al_2O_3$) or ZAZ ($ZrO_2/Al_2O_3/ZrO_2$). The ZA structure may have a structure in which aluminum oxide is stacked on zirconium oxide. The ZAZ structure may have a structure in which zirconium oxide, aluminum oxide, and zirconium oxide are sequentially stacked. The $ZrO_2$, ZA and ZAZ structures may be referred to generally as a zirconium oxide ($ZrO_2$)-based layer. In another embodiment, the dielectric layer 102 may be formed of hafnium (Hf)-based oxide. The dielectric layer 102 may have a stack structure including hafnium oxide ($HfO_2$). The stack structure including hafnium oxide ($HfO_2$) may include HA ($HfO_2/Al_2O_3$) or HAH ($HfO_2/Al_2O_3/HfO_2$). The HA structure may have a structure in which aluminum oxide is stacked on hafnium oxide. The HAH structure may have a structure in which hafnium oxide, aluminum oxide, and hafnium oxide are sequentially stacked. The $HfO_2$, HA, and HAH structures may be referred to as a hafnium oxide ($HfO_2$)-based layer.

In the ZA, ZAZ, HA, and HAH structures, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 102 may include a stack of a high-k material and a high-band gap material having a larger band gap than that of the high-k material. The dielectric layer 102 may include silicon oxide ($SiO_2$) as a high band gap material other than aluminum oxide. Since the dielectric layer 102 includes a high band gap material, leakage current can be suppressed. The high band gap material may be extremely thin. The high band gap material may be thinner than the high-k material.

In another embodiment, the dielectric layer 102 may include a laminated structure in which a high-k material and a high band gap material are alternately stacked. For example, the laminated structure may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structures like above, aluminum oxide ($Al_2O_3$) may be extremely thin.

The upper electrode 103 may include a conductive carbon-containing layer. The content of carbon in the conductive carbon-containing layer may be more than 5 at % and equal to or less than 10 at %. This is because if the carbon content in the film exceeds 10 at %, a problem may occur in film quality due to carbon fume.

The upper electrode 103 may include carbon-doped and oxygen-doped metal nitride. The upper electrode 103 may include carbon-doped and oxygen-doped titanium nitride. For example, the upper electrode 103 may include titanium carbon oxynitride (TiCON).

The upper electrode 103 may have a high work function property and a low crystallinity compared to titanium nitride containing no carbon and oxygen. The work function of carbon, which is 4.8 eV, is higher than the work function of titanium nitride (TiN) without carbon and oxygen, which is 4.5 eV. In this embodiment, the upper electrode 103 may have a higher work function property than that of titanium nitride (TiN) without carbon by forming a conductive carbon-containing layer, for example, carbon-doped and oxygen-doped titanium nitride. In the upper electrode 103, carbon may exist in the form of the formula CH in the film.

In another embodiment, the upper electrode 103 may have a varying carbon content. For example, the upper electrode 103 may have a varying carbon content as a function of the distance from the dielectric layer 102. More generally, the upper electrode 103 may have a varying carbon content as a function of the distance from the outermost surface of the upper electrode 103. For example, the upper electrode 103 may have a low carbon content in a portion adjacent to the dielectric layer 102, and the carbon content may increase as the distance from the dielectric layer 102 increases. In another example, the upper electrode 103 may have a high carbon content in a portion adjacent to the dielectric layer 102, and the carbon content may decrease as the distance from the dielectric layer 102 increases.

In another embodiment, the upper electrode 103 may have a varying oxygen content in the film as a function of the distance from the dielectric layer 102. In yet another embodiment, the upper electrode 103 may have varying contents of carbon and oxygen in the film as a function of the distance from the dielectric layer 102

The upper electrode 103 may be formed by an atomic layer deposition process. The atomic layer deposition process may be performed under conditions that alleviate the reducing properties of the dielectric layer 102. The atomic layer deposition process may be performed at a low temperature of 150° C. to 350° C. in an atmosphere that does not contain chlorine (Cl) and ammonia ($NH_3$) causing reduction of the dielectric layer 102.

As described above, due to the high work function property of the upper electrode 103, it is possible to improve the leakage current characteristic of the capacitor by generating a Schottky barrier through deviation of the work function at the interface with the dielectric layer 102.

In addition, since formation of the upper electrode 103 proceeds under conditions which alleviate the reducing property of the dielectric layer 102, it is possible to omit an interface layer which is heretofore typically used for suppressing the reduction of the dielectric layer 102, thereby simplifying the process.

Furthermore, the upper electrode 103 may maximize the polarization efficiency by alleviating the stress of the dielectric layer due to its low crystallinity.

Figure 2:
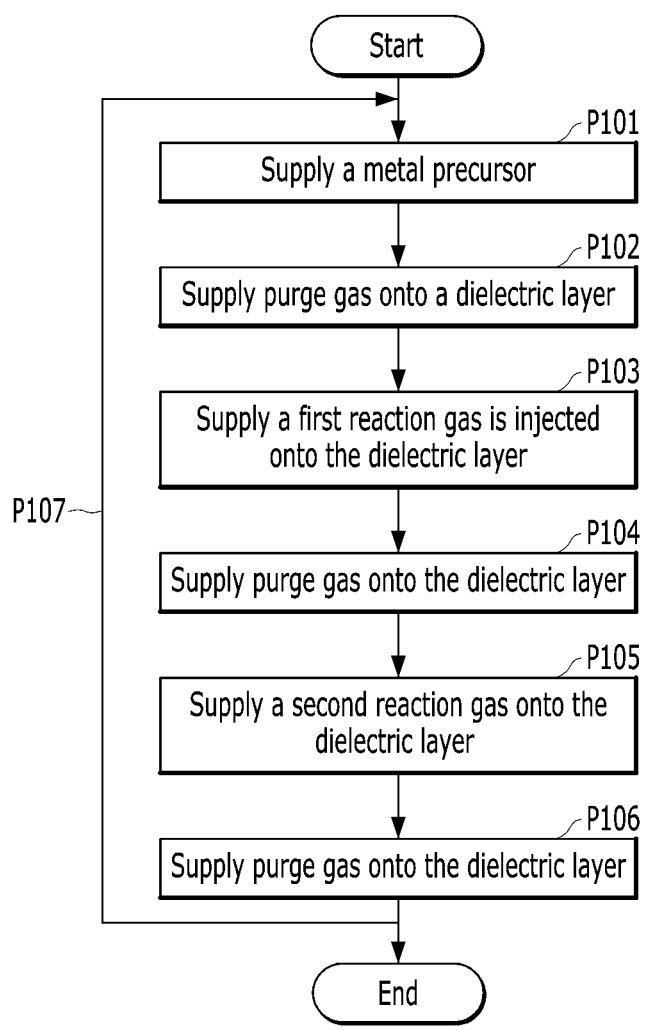
FIG. 2 is a flowchart illustrating a method of forming an upper electrode 103 of FIG. 1.

FIG. 2 is a flowchart illustrating a method of forming the upper electrode 103 of FIG. 1. References to the dielectric layer and the upper electrode in the flowchart of FIG. 2 refer to the dielectric layer 102 and the upper electrode 103 of FIG. 1.

In operation P101 of FIG. 2, a metal precursor layer is formed by supplying a metal precursor including a metal on the dielectric layer in the reaction space. For example, the metal may include titanium, but is not limited thereto. The metal precursor of this embodiment may not contain chlorine (Cl) and ammonia ($NH_3$). The metal precursor may include, for example, TDMAT (Tetrakis(dimethylamino) titanium), but is not limited thereto. The time period for supplying the metal precursor may include, for example, a time period of from 1 second to 10 seconds.

In operation P102 of FIG. 2, unnecessary by-products on the dielectric layer 102 may be removed by supplying a purge gas onto the dielectric layer. The time for supplying the purge gas may include, for example, a time period of from 1 second to 10 seconds.

In operation P103 of FIG. 2, a first reaction gas may be supplied onto the dielectric layer to form a carbon-doped metal nitride. The reaction gas may include nitrogen ($N_2$) remote plasma. The time period for supplying the reaction gas may be adjusted according to the amount of carbon required in the film and, for example, may be within 30 seconds. In an embodiment, the content of carbon in the film of the carbon-doped metal nitride may be adjusted to more than 5 at % and equal to or less than 10 at %.

In operation P104 of FIG. 2, unnecessary by-products may be removed by supplying purge gas on the dielectric layer. The time for supplying the purge gas may include, for example, a time period of from 1 second to 10 seconds.

In operation P105 of FIG. 2, carbon-doped and oxygen-doped metal nitride may be formed by supplying a second reaction gas onto the dielectric layer. The second reaction gas may include $O_2$ or $O_3$. The time period for supplying the reaction gas may be adjusted within 5 seconds.

In operation P106 of FIG. 2, unnecessary by-products may be removed by supplying a purge gas onto the dielectric layer 102 (see FIG. 1). The time for supplying the purge gas may include, for example, a time period of from 1 second to 10 seconds.

As shown in operation P107 of FIG. 2, a unit cycle of the operations P101 to P106 may be repeated a plurality of times until carbon-doped and oxygen-doped metal nitride having a required thickness are formed.

The number of cycles of the atomic layer deposition process may be adjusted to control the thickness of the upper electrode for forming the upper electrode using the atomic layer deposition process according to the method illustrated in FIG. 2. In particular, according to an embodiment of the present invention, the deposition temperature, the carbon content, and the oxygen content in the film may be controlled when forming the upper electrode using the atomic layer deposition process. The atomic layer deposition process may be performed at a low temperature equal to or less than 350° C. in order to reduce the crystallinity of the metal nitride and the reducing property of the dielectric layer. For example, the deposition temperature in the atomic layer deposition process may be adjusted between 150° C. and 350° C.

In another embodiment, the carbon-doped and oxygen-doped metal nitride of the embodiment described above may be applied to the metal gate electrode of the gate pattern to which the high dielectric insulating layer is applied.

In another embodiment, the carbon-doped and oxygen-doped metal nitride of the embodiment described above may be applied to a flash memory to which a tunnel insulating layer of ONO (oxide-nitride-oxide), that is, a control gate is applied.

In another embodiment, the carbon-doped and oxygen-doped metal nitride of the embodiment described above may be applied in place of all processes in which titanium nitride (TiN) is applied as a barrier layer, for example, a barrier layer of a metal wiring.

The carbon-doped and oxygen-doped metal nitride of the present embodiment described above may be applied to an electrode process that requires a low reducing property, a low deposition temperature, and a low stress.

Figure 3A:
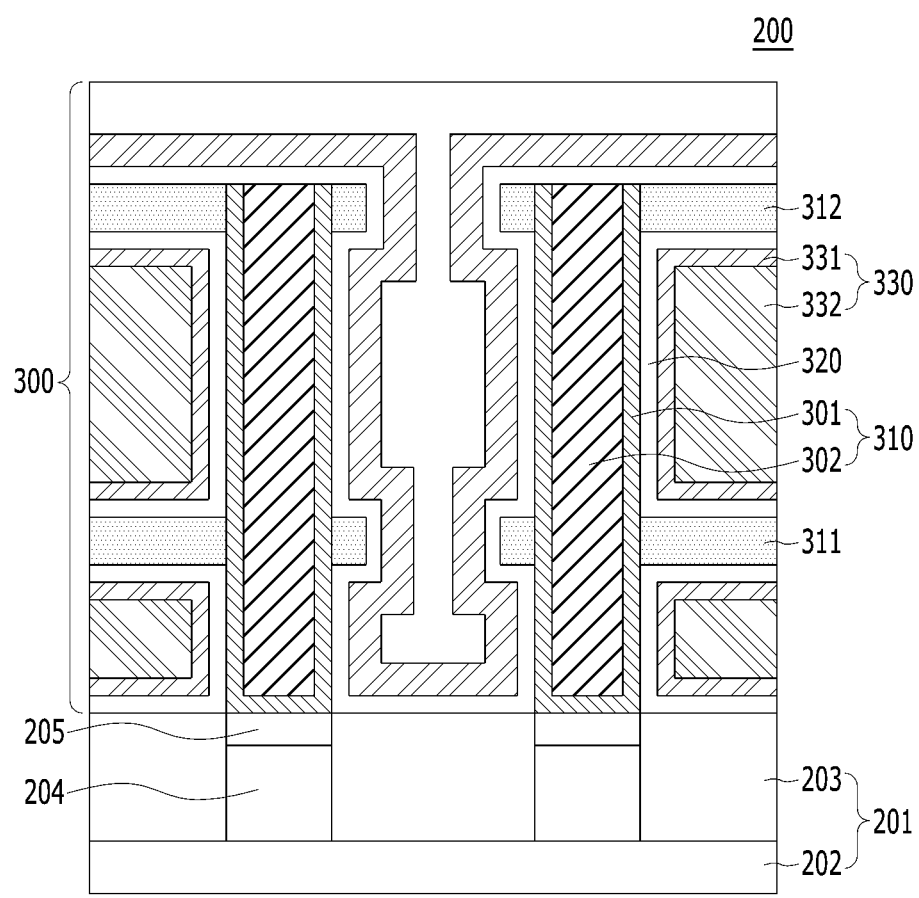
FIGS. 3A and 3B are diagrams illustrating semiconductor devices according to embodiments of the present invention.
Figure 3B:
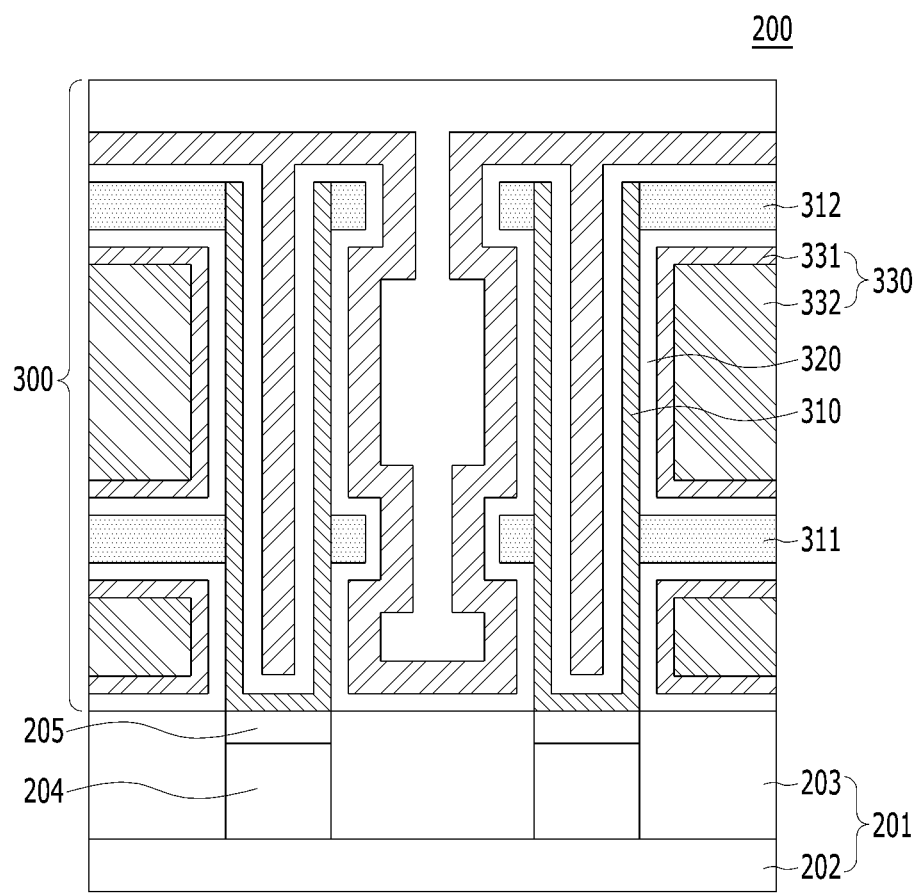

FIGS. 3A and 3B are diagrams illustrating semiconductor devices according to embodiments. The lower electrode 310 of FIG. 3A may have a pillar shape, and the lower electrode 310 of FIG. 3B may have a cylindrical shape.

Referring to FIGS. 3A and 3B, the semiconductor device 200 may include a lower structure 201. The lower structure 201 may be a stack structure including a substrate 202 and an insulating layer 203 formed on the substrate 202. The lower structure 201 may include a plurality of storage node contact structures. The storage node contact structure may penetrate through the insulating layer 203 and be connected to the substrate 202. The storage node contact structure may be a stack of a lower plug 204 and an upper plug 205. The lower plug 204 may include a silicon plug, and the upper plug 205 may include a metal plug. Buried word lines and bit lines may be further formed in the lower structure 201. The buried word lines may be formed in the substrate 202, and the bit lines may be formed between the storage node contact structures.

The semiconductor device 200 may further include a capacitor structure 300. The capacitor structure 300 may be referred to as an upper structure. The capacitor structure 300 may be formed on the lower structure 201. The capacitor structure 300 may include a lower electrode 310, a dielectric layer 320, and an upper electrode 330.

The lower electrode 310 of FIG. 3A may have a pillar-shape. The lower electrode 310 may include a cylinder type electrode 301 and a pillar type electrode 302. The pillar type electrode 302 may be formed inside the cylinder type electrode 301. The cylinder type electrode 301 and the pillar type electrode 302 may be made of the same material or different materials. Both the cylinder type electrode 301 and the pillar type electrode 302 may be made of a metal-based material. The metal-based material may refer to a metal-containing material. In another embodiment, the cylinder type electrode 301 may be a metal-based material, and the pillar type electrode 302 may be a silicon-based material. The silicon-based material may refer to a silicon-containing material. For example, both the cylinder type electrode 301 and the pillar type electrode 302 may be titanium nitride (TiN). The cylinder type electrode 301 may be titanium nitride (TiN), and the pillar type electrode 302 may be doped polysilicon. Doped polysilicon may refer to polysilicon doped with conductive impurities. The lower electrode 310 of FIG. 3B may have a cylinder-shape.

The outer walls of the plurality of lower electrodes 310 may be supported by the first support 311 and the second support 312. The first support 311 and the second support 312 may be referred to as a multi-level support. In another embodiment, the multi-level support may have at least three levels or more. The first support 311 and the second support 312 may include silicon nitride ($Si_3N_4$) and silicon carbon nitride (SiCN).

The dielectric layer 320 may include a single layered structure, a multi-layered structure, and a laminated structure. The dielectric layer 320 may have a doping structure or an intermixing structure. The dielectric layer 320 may include a high-k material. The dielectric layer 320 may have a higher dielectric constant than silicon oxide ($SiO_2$). Silicon oxide may have a dielectric constant of about 3.9, and the dielectric layer 320 may include a material having a dielectric constant of 4 or more. The high-k material may have a dielectric constant of about 20 or more. The high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer 320 may be formed of a composite layer including two or more layers of the high-k materials mentioned above. The dielectric layer 320 may be formed of zirconium (Zr)-based oxide. The dielectric layer 320 may have a stack structure including zirconium oxide ($ZrO_2$). The stack structure including zirconium oxide ($ZrO_2$) may include ZA ($ZrO_2$/$Al_2O_3$) or ZAZ ($ZrO_2$/$Al_2O_3$/$ZrO_2$). The ZA may have a structure in which aluminum oxide is stacked on zirconium oxide. The ZAZ may have a structure in which zirconium oxide, aluminum oxide, and zirconium oxide are sequentially stacked in the recited order. The $ZrO_2$, ZA and ZAZ may be referred to as zirconium oxide ($ZrO_2$)-based layer. In another embodiment, the dielectric layer 320 may be formed of hafnium (Hf)-based oxide. The dielectric layer 320 may have a stack structure including hafnium oxide ($HfO_2$). The stack structure including hafnium oxide ($HfO_2$) may include HA ($HfO_2$/$Al_2O_3$) or HAH ($HfO_2$/$Al_2O_3$/$HfO_2$). The HA may have a structure in which aluminum oxide is stacked on hafnium oxide. The HAH may have a structure in which hafnium oxide, aluminum oxide, and hafnium oxide are sequentially stacked in the recited order. The $HfO_2$, HA and HAH may be referred to as a hafnium oxide ($HfO_2$)-based layer.

In the ZA, ZAZ, HA, and HAH structures, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 320 may include a stack of a high-k material and a high-band gap material having a larger band gap than that of the high-k material. The dielectric layer 320 may include silicon oxide ($SiO_2$) as a high band gap material other than aluminum oxide. Since the dielectric layer 320 includes a high band gap material, leakage current can be suppressed. The high band gap material may be extremely thin. The high band gap material may be thinner than the high-k material.

In another embodiment, the dielectric layer 320 may include a laminated structure in which a high-k material and a high band gap material are alternately stacked. For example, the laminated structure may include the ZAZA ($ZrO_2$/$Al_2O_3$/$ZrO_2$/$Al_2O_3$), ZAZAZ ($ZrO_2$/$Al_2O_3$/$ZrO_2$/$Al_2O_3$/$ZrO_2$), HAHA ($HfO_2$/$Al_2O_3$/$HfO_2$/$Al_2O_3$/) or HAHAH ($HfO_2$/$Al_2O_3$/$HfO_2$/$Al_2O_3$/$HfO_2$). In the laminated structures like above, aluminum oxide ($Al_2O_3$) may be extremely thin.

The upper electrode 330 may be single-layered or multi-layered. The upper electrode 330 may include a conductive carbon-containing layer. According to an embodiment of the present invention, the upper electrode 330 may include a stack structure of a first upper electrode 331 and a second upper electrode 332. The first upper electrode 331 may be conformally formed on the dielectric layer 320. The second upper electrode 332 may be formed to fill a space between the capacitor structures 300.

The first upper electrode 331 may include a material having a lower crystallinity and having a higher work function property than titanium nitride (TiN) under conditions that alleviate the reducing properties of the dielectric layer 320. The first upper electrode 331 may be formed by the atomic layer deposition process shown in the flowchart of FIG. 2. That is, the atomic layer deposition process may be performed at a low temperature of 150° C. to 350° C. in an atmosphere that does not contain chlorine (Cl) and $NH_3$ causing reduction of the dielectric layer 320.

The first upper electrode 331 may include a conductive carbon-containing layer. The content of carbon in the conductive carbon-containing layer may be more than 5 at % and equal to or less than 10 at %. This is because if the carbon content in the film exceeds 10 at %, a problem may occur in film quality due to carbon fume.

The first upper electrode 331 may include carbon-doped and oxygen-doped metal nitride. The first upper electrode 331 may include carbon-doped and oxygen-doped titanium nitride. The first upper electrode 331 may include TiCON.

The first upper electrode 331 may have high work function characteristics and low crystallinity compared to titanium nitride not containing carbon and oxygen. The work function of carbon, which is 4.8 eV, is higher than the work function of titanium nitride (TiN) without carbon and oxygen which is 4.5 eV. According to an embodiment of the present invention, the first upper electrode 331 may have a higher work function property than titanium nitride without carbon by forming a conductive carbon-containing layer, for example, carbon-doped and oxygen-doped titanium nitride. In the first upper electrode 331, carbon may exist in the form of CH in the film.

In another embodiment, the first upper electrode 331 may have a varying carbon content. For example, the first upper electrode 331 may have a varying carbon content as a function of the distance from the dielectric layer 320. More generally, the first upper electrode 331 may have a varying carbon content as a function of the distance from the outermost surface of the first upper electrode 331. For example, the first upper electrode 331 may have a low carbon content in a portion adjacent to the dielectric layer 320, and the carbon content may increase as the distance from the dielectric layer 320 increases. In another example, the first upper electrode 331 may have a high carbon content in a portion adjacent to the dielectric layer 320, and the carbon content may decrease as the distance from the dielectric layer 320 increases.

The first upper electrode 331 may have a varying oxygen content as a function of the distance from the dielectric layer 320. More generally, the first upper electrode 331 may have a varying oxygen content as a function of the distance from the outermost surface of the first upper electrode 331. In another embodiment, the first upper electrode 331 may have varying contents of carbon and oxygen in the film according to the thickness. For example, the first upper electrode 331 may have varying contents of carbon and oxygen as a function of the distance from the dielectric layer 320.

The second upper electrode 332 may include a silicon-containing material, a germanium-containing material, a metal-containing material, or a combination thereof. The second upper electrode 332 may include a metal, metal nitride, metal carbide, conductive metal oxide, or a combination thereof. The second upper electrode 332 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$), or a combination thereof. The second upper electrode 332 may include a silicon layer (Si layer), a germanium layer (Ge layer), a silicon germanium layer (SiGe layer), or a combination thereof. The second upper electrode 332 may be formed by stacking a silicon germanium layer on a silicon layer (Si/SiGe). The second upper electrode 332 may be formed by stacking a silicon germanium layer on a germanium layer (Ge/SiGe). The second upper electrode 332 may include a stack of a silicon-containing material and a metal-containing material. The second upper electrode 332 may be formed by stacking a silicon germanium layer and tungsten nitride (SiGe/WN).

According to an embodiment, the second upper electrode 332 may include a gap fill material and a low resistance material. The gap fill material may include silicon germanium (SiGe), and the low resistance material may include tungsten (W). The gap fill material may fill a narrow gap between the lower electrodes 310 without a void. The low resistance material may lower the resistance of the upper electrode 330.

FIGS. 4A to 4I are diagrams illustrating a method for fabricating a semiconductor device according to an embodiment of the present invention.

Figure 4A:
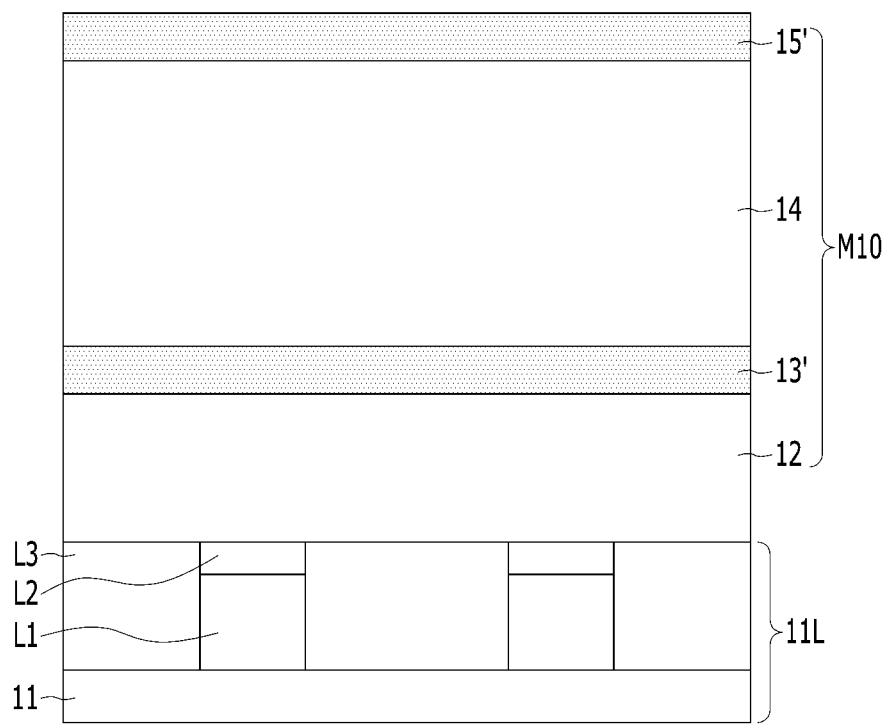
FIGS. 4A to 4I are diagrams illustrating a method for fabricating a semiconductor device according to an embodiment of the present invention.

As shown in FIG. 4A, a lower structure 11L may be formed. The lower structure 11L may include a semiconductor substrate, semiconductor devices, and interlayer insulating layers. The lower structure 11L may include a region in which memory cells are disposed. The lower structure 11L may correspond to the lower structure 201 of FIGS. 3A and 3B. The lower structure 11L may include a substrate 11 and a storage node contact plug formed on the substrate 11. The storage node contact plug may be a stack of the lower plug L1 and the upper plug L2. The storage node contact plug may be connected to the substrate 11 by penetrating through the interlayer insulating layer L3.

A mold structure M10 may be formed on the lower structure 11L. The mold structure M10 may include a first mold layer 12, a first support layer 13', a second mold layer 14, and a second support layer 15' sequentially stacked on the lower structure 11L. The first mold layer 12 and the second mold layer 14 may be, for example, silicon oxide ($SiO_2$). The first mold layer 12 and the second mold layer 14 may be formed using a vapor deposition process, for example, chemical vapor deposition (CVD) or physical vapor deposition (PVD).

The first and second support layers 13' and 15' may be formed of a material having an etch selectivity with respect to the first and second mold layers 12 and 14. The first support layer 13' and the second support layer 15' may include silicon nitride or silicon carbon nitride (SiCN). The second support layer 15' may be thicker than the first support layer 13'. The first support layer 13' and the second support layer 15' may be thinner than the first mold layer 12 and the second mold layer 14.

Figure 4B:
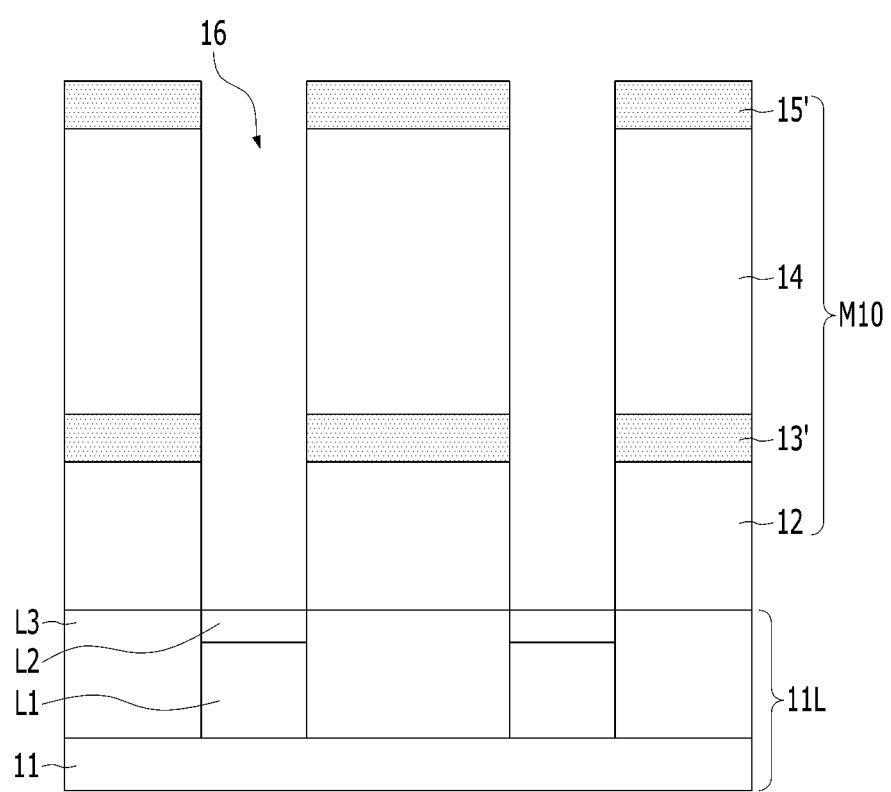

As shown in FIG. 4B, a plurality of openings 16 may be formed. The openings 16 may be formed by etching the mold structure M10 using a mask layer (not shown). In order to form the openings 16, the first support layer 15', the second mold layer 14, the first support layer 13', and the first mold layer 12 may be sequentially etched using the mask layer as an etch barrier. To form the opening 16, dry etching, wet etching, or a combination thereof may be used. The opening 16 may be referred to as a hole in which the lower electrode (or storage node) is to be formed. The opening 16 may have a high aspect ratio. The opening 16 may have an aspect ratio of at least 1:1. For example, the opening 16 may have a high aspect ratio of 1:10 or more. The aspect ratio as used herein refers to a ratio of width to height.

The mold structure M10 including a plurality of openings 16 may be formed by a series of etching processes as described above.

Figure 4C:
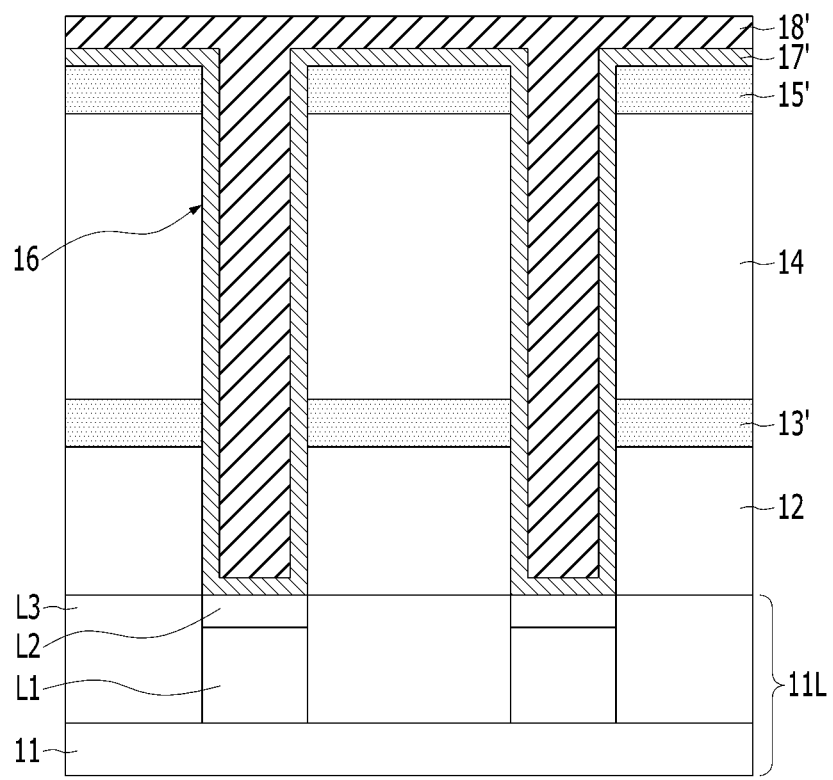

As shown in FIG. 4C, a first conductive material 17' may be formed in the openings 16. The first conductive material 17' may be conformally formed on the mold structure M10 in which the openings 16 are formed. A second conductive material 18' may be formed on the first conductive material 17'. The second conductive material 18' may fill the openings 16.

The first conductive material 17' and the second conductive material 18' may include polysilicon, metal, metal nitride, conductive metal nitride, metal silicide, noble metal, or a combination thereof. The first conductive material 17' and the second conductive material 18' may include at least one selected from among titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt), and a combination thereof. In an embodiment, both the first conductive material 17' and the second conductive material 18' may include titanium nitride (TiN). The first conductive material 17' and the second conductive material 18' may include titanium nitride (ALD-TiN) formed by atomic layer deposition (ALD).

In another embodiment, the first conductive material 17' and the second conductive material 18' may include titanium nitride and tungsten, respectively. In another embodiment, the first conductive material 17' and the second conductive material 18' may include titanium nitride and polysilicon, respectively.

In another embodiment, the first conductive material 17' and the second conductive material 18' may be the same material and formed as a single layer. That is, the opening 16 may be filled with any one of the first conductive material 17' and the second conductive material 18'.

Figure 4D:
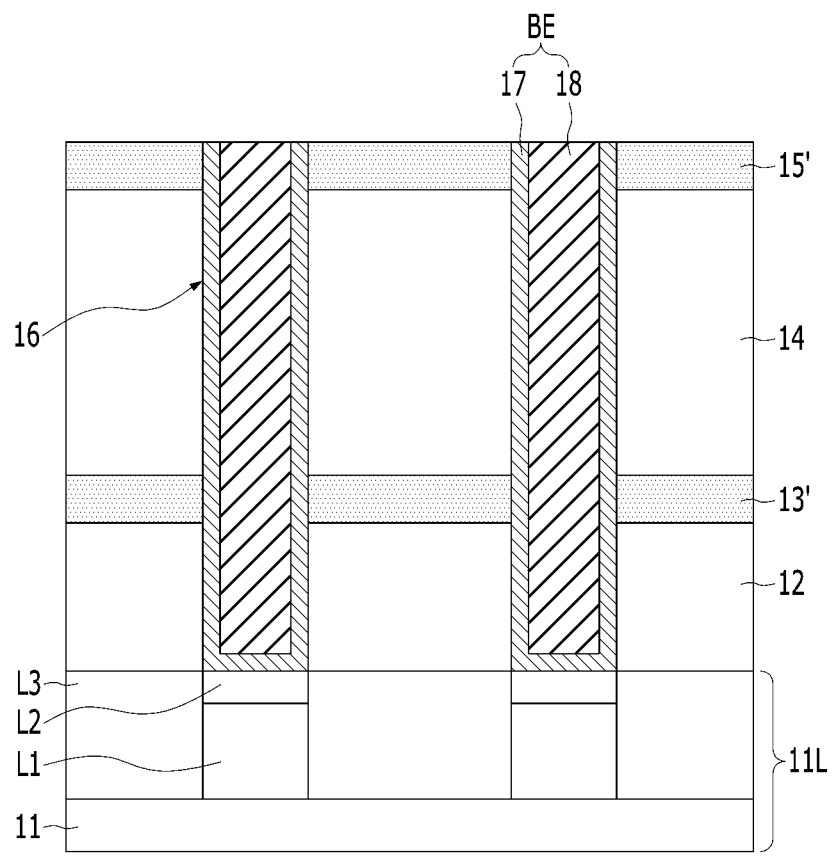

As shown in FIG. 4D, a lower electrode BE may be formed. A lower electrode separation process may be performed to form the lower electrode BE. The lower electrode separation process may include an etch back process or/and a CMP process. The first conductive material 17' and the second conductive material 18' disposed on the second support layer 15' may be removed by the lower electrode separation process.

The lower electrode BE may include a cylinder type electrode 17 and a pillar type electrode 18. The cylinder type electrode 18 may be formed by etching the first conductive material 17', and the pillar type electrode 18 may be formed by etching the second conductive material 18'.

Figure 4E:
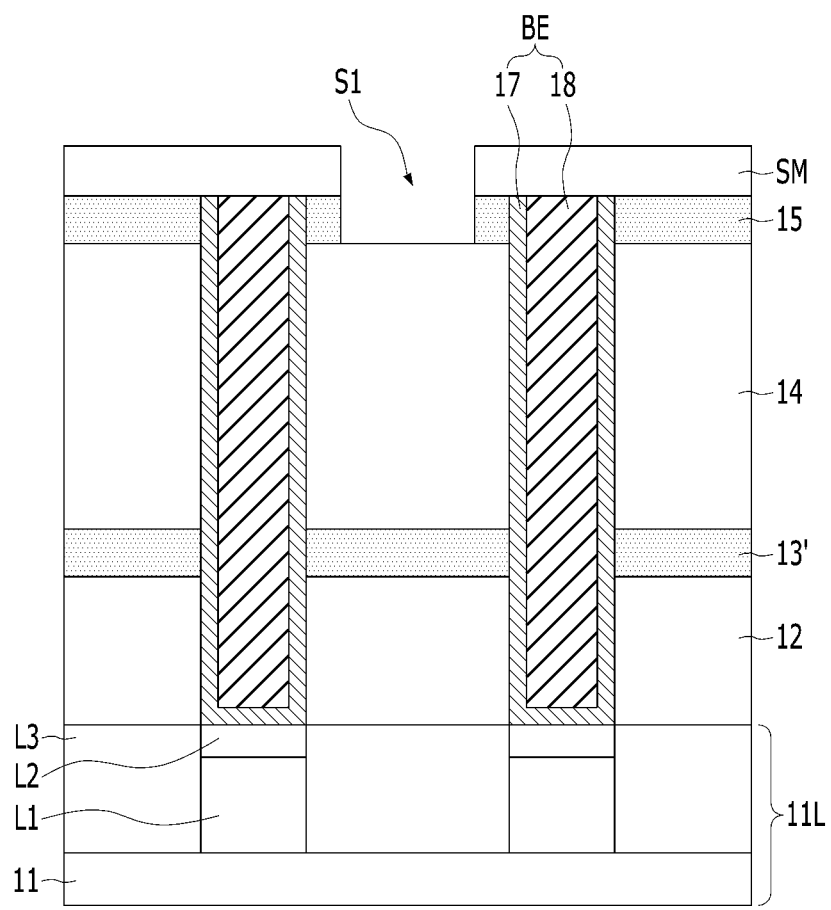

As shown in FIG. 4E, a second support 15 may be formed. In order to form the second support 15, a part of the second support layer 15' may be etched using a support mask layer SM. A support opening S1 and a second support 15 may be formed by etching the second support layer 15'.

The second support 15 may contact the upper sidewall of the lower electrode BE. The upper surface of the second mold layer 14 may be exposed by the second support 15. The second support 15 may have a shape surrounding a portion of the outer wall of the lower electrode BE. As such, the second support 15 may prevent the lower electrode BE having a large aspect ratio from collapsing in a subsequent process of removing the second mold layer 14.

Figure 4F:
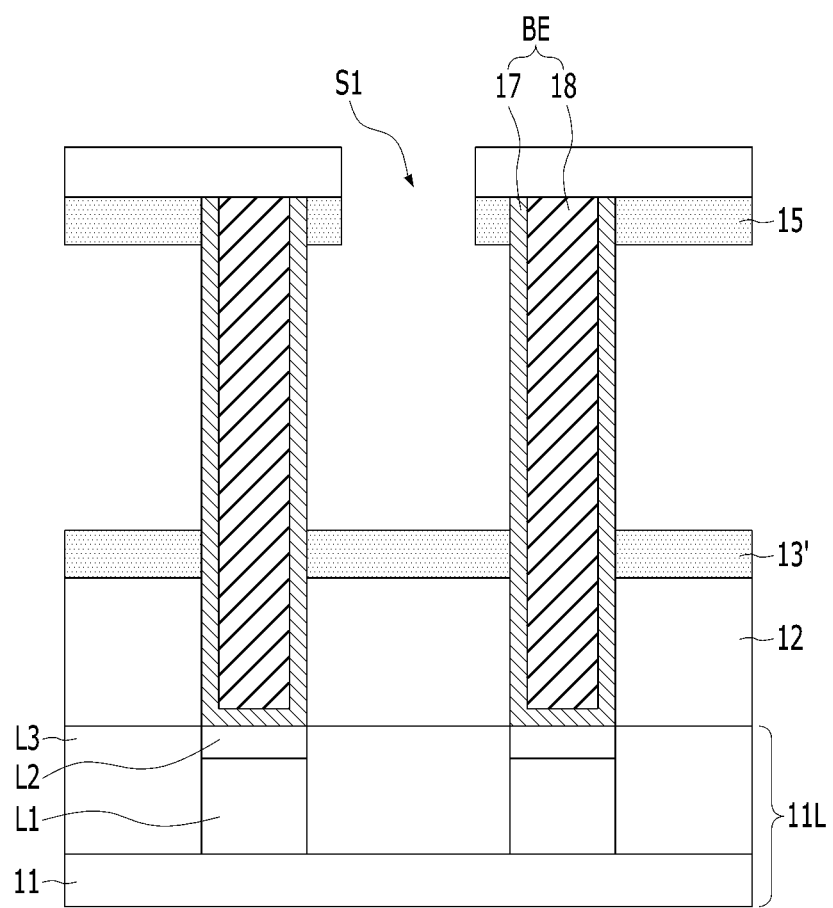

As shown in FIG. 4F, the second mold layer 14 may be removed. For example, the second mold layer 14 may be removed by a wet dip-out process. A wet chemical for removing the second mold layer 14 may be supplied through the support opening S1. As the wet chemical, one or more chemicals such as HF, $NH_4F/NH_4OH$, $H_2O_2$, HCl, $HNO_3$, and $H_2SO_4$ may be used.

For example, when the second mold layer 14 is formed of silicon oxide, the second mold layer 14 may be removed by a wet dip-out process using a chemical containing hydrofluoric acid. When the second mold layer 14 is removed, the second support 15 having an etch selectivity for the second mold layer 14 may remain without being removed. Accordingly, since the adjacent lower electrode BE is supported by the second support 15, the lower electrode BE may be prevented from collapsing.

Figure 4G:
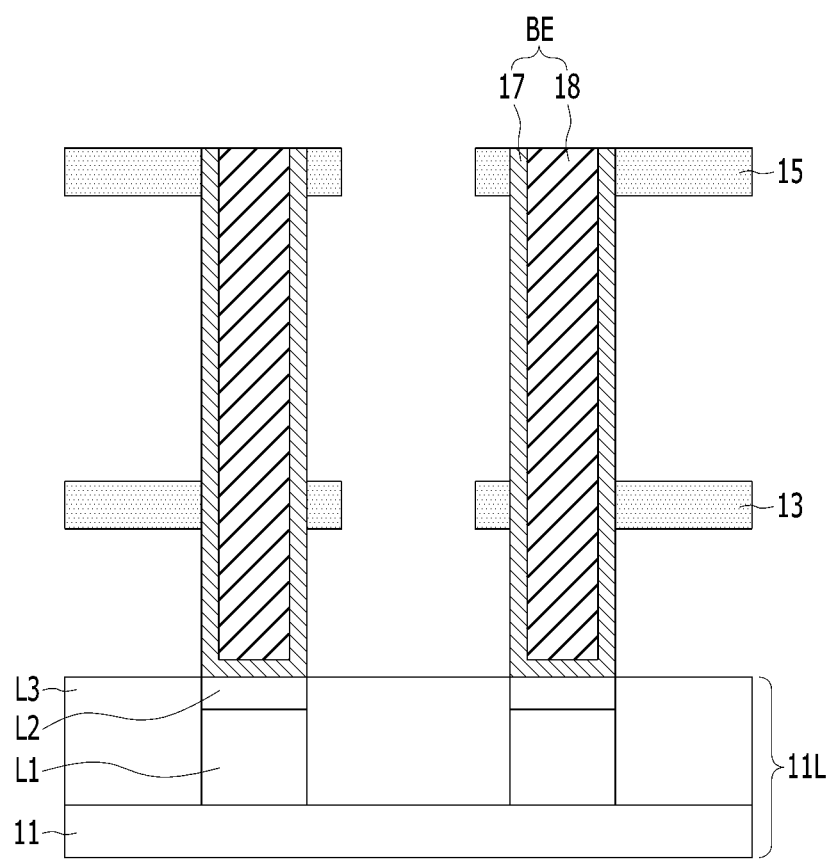

As shown in FIG. 4G, a first support 13 may be formed. A part of the first support layer 13' may be etched using the support mask layer SM. The first support 13 may be formed by etching the first support layer 13'.

After the first support 13 is formed, the first mold layer 12 may be removed. For example, the first mold layer 12 may be removed by a wet dip-out process. A wet chemical for removing the first mold layer 12 may be supplied through the support opening S1. As the wet chemical, one or more chemicals of, for example, HF, $NH_4F/NH_4OH$, $H_2O_2$, HCl, $HNO_3$, and $H_2SO_4$ may be used.

For example, when the first mold layer 12 is formed of silicon oxide, the first mold layer 12 may be removed by a wet dip-out process. When the first mold layer 12 is removed, the lower electrode BE may be prevented from collapsing because it is supported by the second support 15 and the first support 13 having an etch selectivity with respect to the first mold layer 12.

As the second mold layer 14 and the first mold layer 12 are removed, the outer wall of the lower electrode BE except for portions in contact with the first and second supports 13 and 15 may be exposed. The upper portion of the lower electrode BE may be supported by the second support 15. The middle portion of the lower electrode BE may be supported by the first support 13.

Subsequently, the support mask layer SM may be removed.

Figure 4H:
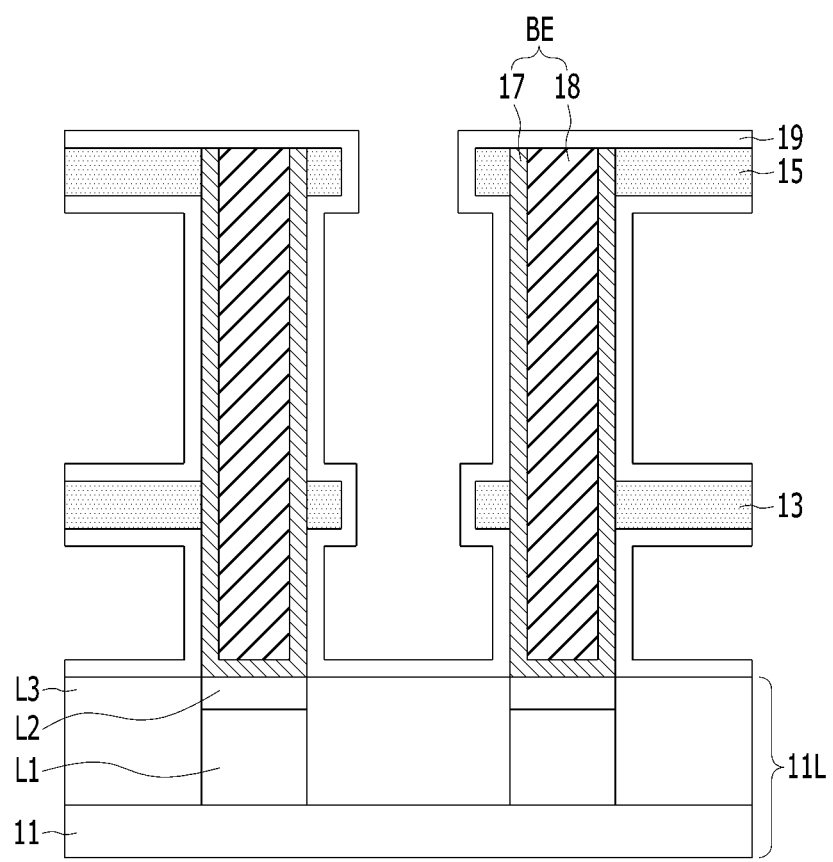

As shown in FIG. 4H, a dielectric layer 19 may be formed. The dielectric layer 19 may be formed on the lower electrode BE and the first and second supports 13 and 15. A part of the dielectric layer 19 may cover the lower structure 11L. The dielectric layer 19 may include a high-k material having a higher dielectric constant than silicon oxide. A high-k material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer 19 may be formed of a composite layer including two or more layers of the high-k materials mentioned above. The dielectric layer 19 may be formed of zirconium (Zr)-based oxide. The dielectric layer 19 may have a stack structure including zirconium oxide ($ZrO_2$). The stack structure including zirconium oxide ($ZrO_2$) may include ZA ($ZrO_2/Al_2O_3$) or ZAZ ($ZrO_2/Al_2O_3/ZrO_2$). The ZA may have a structure in which aluminum oxide is stacked on zirconium oxide. The ZAZ may have a structure in which zirconium oxide, aluminum oxide, and zirconium oxide are sequentially stacked. The $ZrO_2$, ZA and ZAZ may be referred to as zirconium oxide ($ZrO_2$)-based layer. In another embodiment, the dielectric layer 19 may be formed of hafnium (Hf)-based oxide. The dielectric layer 19 may have a stack structure including hafnium oxide ($HfO_2$). The stack structure including hafnium oxide ($HfO_2$) may include HA ($HfO_2/Al_2O_3$) or HAH ($HfO_2/Al_2O_3/HfO_2$). The HA may have a structure in which aluminum oxide is stacked on hafnium oxide. The HAH may have a structure in which hafnium oxide, aluminum oxide, and hafnium oxide are sequentially stacked. $HfO_2$, HA and HAH may be referred to as a hafnium oxide ($HfO_2$)-based layer.

In the ZA, ZAZ, HA, and HAH structures, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 102 may include a stack of a high-k material and a high-band gap material having a larger band gap than that of the high-k material. The dielectric layer 19 may include silicon oxide ($SiO_2$) as a high band gap material other than aluminum oxide. Since the dielectric layer 19 contains a high band gap material, leakage current can be suppressed. The high band gap material may be extremely thin. The high band gap material may be thinner than the high-k material.

In another embodiment, the dielectric layer 19 may include a laminated structure in which a high-k material and a high band gap material are alternately stacked. For example, the laminated structure may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structures like above, aluminum oxide ($Al_2O_3$) may be extremely thin.

Figure 4I:
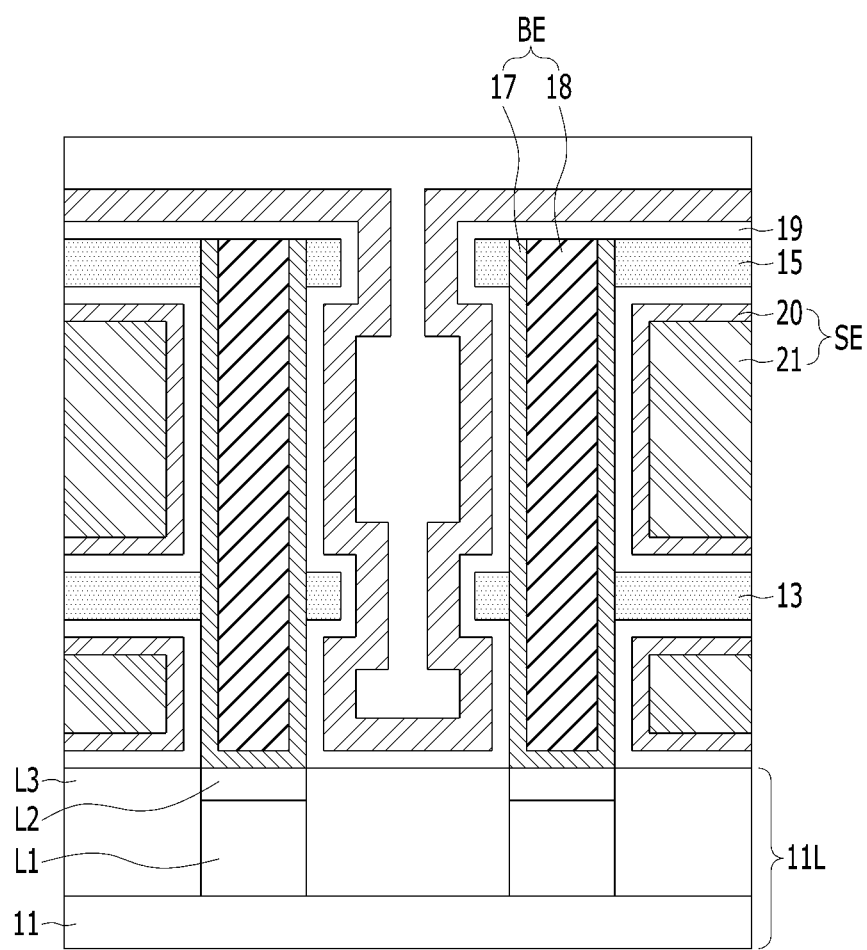

As shown in FIG. 4I, the upper electrode SE may be formed on the dielectric layer 19. The upper electrode SE may include a stack structure of a first upper electrode 20 and a second upper electrode 21. The first upper electrode 20 may be conformally formed on the dielectric layer 19. The second upper electrode 21 may fill a space between adjacent lower electrodes BE.

The first upper electrode 20 may include a material having lower crystallinity and a higher work function property than titanium nitride (TiN) under conditions that alleviate the reduction properties of the dielectric layer 19. The first upper electrode 20 may be formed by the atomic layer deposition process shown in the flowchart of FIG. 2. That is, the atomic layer deposition process may be performed at a low temperature of 150° C. to 350° C. in an atmosphere that does not contain chlorine (Cl) and $NH_3$ causing reduction of the dielectric layer 19.

The first upper electrode 20 may include a conductive carbon-containing layer. The content of carbon in the conductive carbon-containing layer may be more than 5 at % and equal to or less than 10 at %. This is because if the carbon content in the film exceeds 10 at %, a problem may occur in film quality due to carbon fume.

The first upper electrode 20 may include carbon-doped and oxygen-doped metal nitride. The first upper electrode 20 may include carbon-doped and oxygen-doped titanium nitride. The first upper electrode 20 may include TiCON.

The first upper electrode 20 may have high work function property and low crystallinity compared to titanium nitride not containing carbon and oxygen. The work function of carbon, which is 4.8 eV, is higher than the work function of titanium nitride (TiN) without carbon and oxygen, which is 4.5 eV. In an embodiment, the first upper electrode 20 may have a higher work function property than titanium nitride without carbon by forming a conductive carbon-containing layer, for example, carbon-doped and oxygen-doped titanium nitride. In the first upper electrode 20, carbon may exist in the form of CH in the film.

In another embodiment, the first upper electrode 20 may have a varying carbon content in the film as a function of the distance from the dielectric layer 19. For example, the first upper electrode 20 may have a low carbon content in a portion adjacent to the dielectric layer 19, and the carbon content may increase as the distance from the dielectric layer 19 increases. In another example, the first upper electrode 20 may have a high carbon content in a portion adjacent to the dielectric layer 19, and the carbon content may decrease as the distance from the dielectric layer 19 increases.

In another embodiment, the first upper electrode 20 may have a varying oxygen content in the film as a function of the distance from the dielectric layer 19. In another embodiment, the first upper electrode 20 may have varying contents of carbon and oxygen in the film depending on the thickness.

The first upper electrode 20 may be formed by an atomic layer deposition process. The atomic layer deposition process may be performed under conditions that alleviate the reducing property of the dielectric layer 19. The atomic layer deposition process may be performed at a low temperature of 150° C. to 350° C. in an atmosphere that does not contain chlorine (Cl) and $NH_3$ causing reduction of the dielectric layer 19. The first upper electrode 20 may be formed by the atomic layer deposition process shown in the flowchart of FIG. 2.

The second upper electrode 21 may include a silicon-containing material, a germanium-containing material, a metal-containing material, or a combination thereof. The second upper electrode 21 may include a metal, metal nitride, metal carbide, conductive metal oxide, or a combination thereof. The second upper electrode 21 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$), or a combination thereof. The second upper electrode 21 may include a silicon layer (Si layer), a germanium layer (Ge layer), a silicon germanium layer (SiGe layer), or a combination thereof. The second upper electrode 21 may be formed by stacking a silicon germanium layer on a silicon layer (Si/SiGe). The second upper electrode 21 may be formed by stacking a silicon germanium layer on a germanium layer (Ge/SiGe). The second upper electrode 21 may include a stack of a silicon-containing material and a metal-containing material. The second upper electrode 21 may be formed by stacking a silicon germanium layer and a tungsten nitride (SiGe/WN). Silicon germanium may be doped with boron. For example, the metal-containing material may be a stack of tungsten nitride and tungsten (WN/W).

In an embodiment, the second upper electrode 21 may include a gap fill material and a low resistance material. The gap fill material may include silicon germanium (SiGe), and the low resistance material may include tungsten (W). The gap fill material may fill a narrow gap between the lower electrodes BE without a void. The low resistance material may lower the resistance of the upper electrode SE.

Various embodiments have been described for the problem to be solved above, but it will be readily appreciated by one of ordinary skill in the art that it is apparent that various changes and modifications can be made thereto without departing from the scope of the disclosure.

What is claimed is:

1. A capacitor, comprising:
a lower electrode;
a dielectric layer over the lower electrode; and
an upper electrode over the dielectric layer, the upper electrode including a conductive carbon-containing layer,
wherein a carbon content in the conductive carbon-containing layer is more than 5% and equal to or less than 10%,
wherein the conductive carbon-containing layer includes a carbon and oxygen.

2. The capacitor of claim 1, wherein the conductive carbon-containing layer includes a carbon-doped and oxygen-doped metal nitride.

3. The capacitor of claim 1, wherein the conductive carbon-containing layer includes a carbon-doped and oxygen-doped titanium nitride.

4. The capacitor of claim 1, wherein the conductive carbon-containing layer includes titanium carbon oxynitride.

5. The capacitor of claim 1, wherein the conductive carbon-containing layer has a varying carbon content as a function of the distance from the dielectric layer.

6. The capacitor of claim 1, wherein the upper electrode further includes a semiconductor material layer formed over the conductive carbon-containing layer.

7. The capacitor of claim 1, wherein the upper electrode further includes a stack structure of a silicon germanium layer and a tungsten layer over the conductive carbon-containing layer.

8. The capacitor of claim 1, wherein the lower electrode has a pillar-shape or a cylinder-shape.

9. The capacitor of claim 1, further including a support supporting an outer wall of the lower electrode.

10. A semiconductor device, comprising:
a dielectric layer over a substrate; and
a metal electrode over the dielectric layer, the metal electrode including a conductive carbon-containing layer,
wherein a carbon content in the conductive carbon-containing layer is more than 5% and equal to or less than 10%,
wherein the conductive carbon-containing layer includes a carbon and oxygen.

11. The semiconductor device of claim 10, wherein the dielectric layer includes a high-k material.

12. The semiconductor device of claim 10, wherein the conductive carbon-containing layer includes a carbon-doped and oxygen-doped metal nitride.

13. The semiconductor device of claim 10, wherein the conductive carbon-containing layer includes a carbon-doped and oxygen-doped titanium nitride.

14. The semiconductor device of claim 10, wherein the conductive carbon-containing layer includes titanium carbon oxynitride.

15. The semiconductor device of claim 10, wherein the conductive carbon-containing layer has a varying carbon content as a function of the distance from the dielectric layer.

16. The semiconductor device of claim 10, wherein the dielectric layer includes a tunnel dielectric layer of an ONO (Oxide-Nitride-Oxide) structure.

* * * * *